(12) United States Patent
De Virgiliis et al.

(10) Patent No.: US 8,705,772 B2
(45) Date of Patent: Apr. 22, 2014

(54) METHOD FOR ADJUSTING THE MAXIMUM OUTPUT POWER OF A VALVE POWER AMPLIFIER STAGE FOR AN AUDIO AMPLIFIER, AND CORRESPONDING VALVE POWER AMPLIFIER STAGE

(75) Inventors: Marco De Virgiliis, Citta' Sant' Angelo (IT); Sisinio Olivastri, Lanciano (IT); Mario Fulvio Caramanico, Casalincontrada (IT)

(73) Assignee: Parsek S.r.l., San Giovanni Teatino (IT)

( * ) Notice: Subject to any disclaimer, the term of this patent is extended or adjusted under 35 U.S.C. 154(b) by 393 days.

(21) Appl. No.: 13/064,300

(22) Filed: Mar. 16, 2011

(65) Prior Publication Data
US 2011/0311076 A1  Dec. 22, 2011

(30) Foreign Application Priority Data
Mar. 16, 2010  (IT) .................................. BO10A0162

(51) Int. Cl.
*H03F 3/68*  (2006.01)
(52) U.S. Cl.
USPC ......................................... 381/120
(58) Field of Classification Search
USPC ........................................ 381/120–121, 28
See application file for complete search history.

(56) References Cited

U.S. PATENT DOCUMENTS

| 5,099,332 A | * | 3/1992 | Grolleau et al. | ............. 348/723 |
| 7,944,302 B2 | * | 5/2011 | Adams | ........................ 330/267 |
| 2011/0158437 A1 | * | 6/2011 | Taffner et al. | ................. 381/120 |

FOREIGN PATENT DOCUMENTS

| FR | 2817411 A1 | * | 5/2002 | ............... H03F 9/00 |
| GB | 657 701 A | | 9/1951 | |
| GB | 2 446 614 A9 | | 9/2008 | |
| GB | 2 462 368 A | | 2/2010 | |
| GB | 2 462 445 A | | 2/2010 | |
| KR | 2008 0057114 A | | 6/2008 | |

OTHER PUBLICATIONS

Italian Search Report in IT Appln. No. BO20100162, dated Jan. 26, 2011.

* cited by examiner

*Primary Examiner* — Duc Nguyen
*Assistant Examiner* — Anita Masson
(74) *Attorney, Agent, or Firm* — Venable LLP; Robert S. Babayi; Robert Kinberg

(57) ABSTRACT

A valve power amplifier stage for an audio amplifier, which amplifier stage has at least one thermionic valve and a polarization circuit for polarizing the anode, the cathode and the control grid of the thermionic valve so as to determine the maximum output power. The polarization circuit comprises an adjusting module for adjusting the feed voltage of the anode and the polarization voltage of the control grid so as to adjust the maximum output power of the thermionic valve, and a potentiometer coupled with the adjusting module for allowing a user to control the adjusting means so as to select the desired maximum output power from a plurality of predetermined output power values.

11 Claims, 2 Drawing Sheets

METHOD FOR ADJUSTING THE MAXIMUM OUTPUT POWER OF A VALVE POWER AMPLIFIER STAGE FOR AN AUDIO AMPLIFIER, AND CORRESPONDING VALVE POWER AMPLIFIER STAGE

The present invention relates to a method for adjusting the maximum power output of a valve power amplifier stage for an audio amplifier, and to a corresponding valve power amplifier stage.

In particular, the present invention is advantageously, but not exclusively, applied to audio valve amplifiers for musical instruments, such as acoustic guitars, electric guitars or electric basses, to which explicit reference will be made below without therefore loosing in generality.

BACKGROUND OF THE INVENTION

Audio valve amplifiers for musical instruments, in particular for electric guitars, comprise a valve power amplifier stage connectable to the input of an acoustic speaker and comprising at least one thermionic valve, e.g. a thermionic valve in a single-ended configuration or two thermionic valves in a push-pull configuration. The thermionic valves used may be triodes, tetrodes or pentodes. The valve power amplifier stage comprises a polarization circuit for polarizing the anode, cathode and control grid of one or more thermionic valves. The polarization of thermionic valves determines the working point of the thermionic valves and the maximum output power deliverable by the thermionic valves.

These audio amplifiers are normally used under high distortion conditions of the valve power amplifier stage in order to obtain specific sound features. This means that the power amplifier stage should often work at the maximum output power and that musicians should tolerate considerable acoustic pressure levels.

In order to reduce the acoustic pressure of the distorted sound, a solution is known of switching the operating mode of the thermionic valve, e.g. from pentode to triode, or changing the operating class of the thermionic valves, e.g. moving from class AB to class A. In both cases, a reduced number (up to three) of discrete maximum output power levels is obtained.

Another known solution is that of inserting an adjustable resistive power attenuator between the output of the power amplifier stage and the input of the acoustic speaker, by means of which the acoustic pressure generated by the acoustic speaker can be adjusted among a higher number of discrete levels. However, the resistive power attenuator appreciably alters some features of the audio valve amplifier, such as for example damping and the impedance curve seen from the amplifier. Furthermore, the thermionic valve always works at maximum power also when the acoustic pressure produced by the acoustic speaker is set to low levels.

SUMMARY OF THE INVENTION

It is the object of the present invention to provide a power amplifier stage for an audio valve amplifier, which is free from the above-described drawbacks while being easy and cost-effective to be implemented.

In accordance with the present invention, a valve power amplifier stage and a method for adjusting the maximum output power of a valve power amplifier stage are provided as defined in the appended claims.

BRIEF DESCRIPTION OF THE DRAWINGS

The present invention will now be described with reference to the accompanying drawings, which illustrate a non-limitative embodiment thereof, in which.

DETAILED DESCRIPTION OF THE INVENTION

Figure 1:
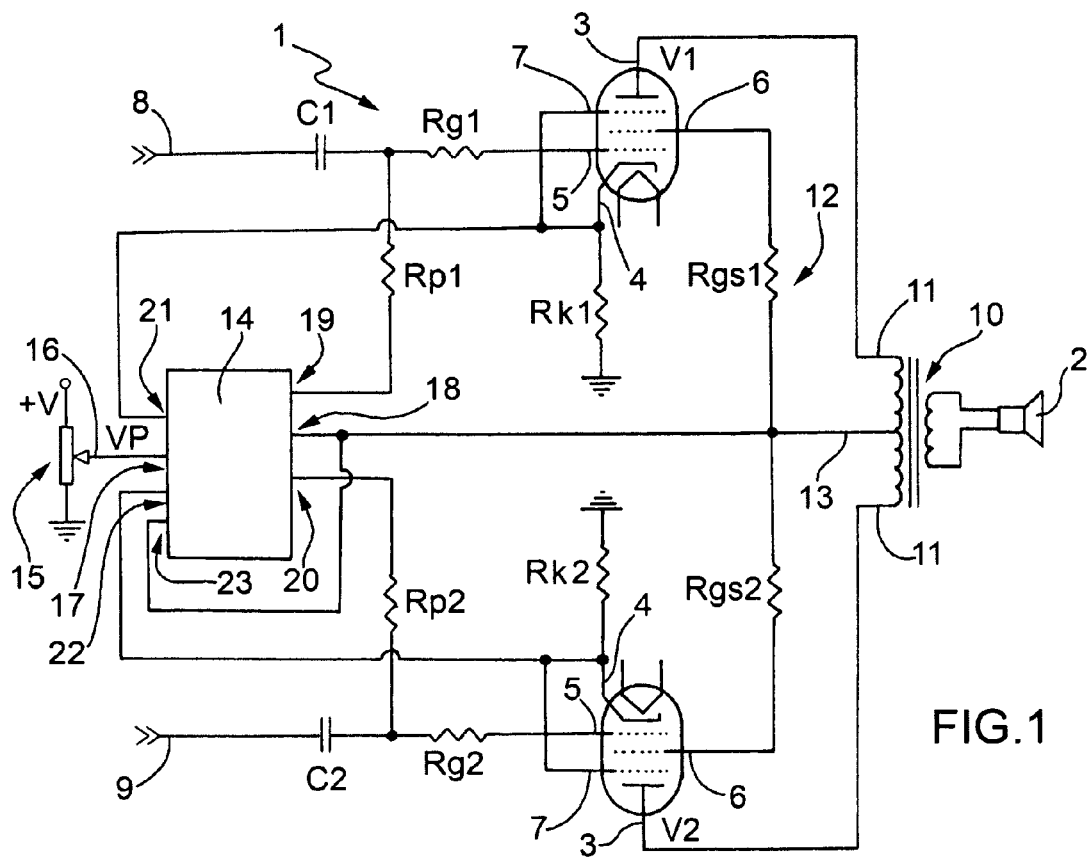
FIG. 1 shows a simplified circuit diagram of the valve power amplifier stage made according to the dictates of the invention.

In FIG. 1, numeral 1 indicates as a whole a valve power amplifier stage according to the invention. For simplicity, the valve power amplifier stage 1 will be called amplifier stage 1 below. The amplifier stage 1 is the output stage of an audio valve amplifier (not shown) and is adapted to be connected between a further stage (not shown) of the audio valve amplifier and an acoustic speaker 2. Amplifier stage 1 comprises two substantially identical thermionic valves V1 and V2, which consist of two pentodes, and a polarization circuit for connecting the two valves V1 and V2 according to a push-pull configuration and polarizing anode 3, cathode 4, control grid 5, screen grid 6 and suppression grid 7 of each valve V1, V2. The polarization of terminals 3-7 of valves V1, V2 by the polarization circuit determines the working point of each valve V1, V2 and the maximum output power deliverable by each valve V1, V2. Amplifier stage 1 comprises two audio signal inputs 8 and 9 for receiving respective audio signals supplied by the upstream stage and an output transformer 10 with primary winding connected between anodes 3, i.e. with each end tap 11 of the primary winding connected to a respective anode 3. The further upstream stage of amplifier stage 1 consists, for example, of an inverter stage to allow amplifier stage 1 to work in push-pull mode. Each valve V1, V2 consists, for example, of a pentode commercially known with the code EL34.

The polarization circuit comprises a resistor network 12 for connecting valves V1 and V2 in a substantially known manner to the audio signal inputs 8 and 9 and to the output transformer 10. Resistor network 12 comprises two resistors Rg1 and Rg2, each connecting control grid 5 of a respective valve V1, V2 to a respective audio signal input 8, 9 by means of a respective decoupling capacitor C1, C2. Resistor network also comprises two resistors Rgs1 and Rgs2, each connecting a screen grid 6 of a respective valve V1, V2 to a central tap 13 of the primary winding of the output transformer 10. Each suppression grid 7 is directly connected to the respective cathode 4.

According to the present invention, the polarization circuit comprises: an electronic adjusting module 14 connected to the resistor network 12 to adjust the feed voltage of each anode 3 and the polarization voltage of each control grid 5, so as to adjust the maximum output power and the working point of each valve V1 and V2; and a selector comprising a potentiometer 15 coupled to the adjusting module 14 to allow a user to control the adjusting module 14, so as to select the desired maximum output power from a plurality of predetermined output power values.

Potentiometer 15 is supplied by direct current and has its central terminal 16 coupled to a selection input 17 of adjusting module 14. Selection input 17 receives a selection signal thus consisting of the direct current voltage VP present on the central terminal 16.

Adjusting module 14 has an output 18 coupled to the central tap 13 of output transformer 3, and thus connected to both anodes 3, to supply the same supply power voltage to anodes 3. Adjusting module 14 comprises two further outputs 19 and 20, each of which is connected to the control grid 5 of a respective valve V1, V2 by means of a respective resistor Rp1, Rp2 arranged in series, from the point of view of the polarization currents, to the resistor Rg1, Rg2. Thereby, adjusting module 14 is able to independently polarize the control grids 5 at respective polarization voltages.

Adjusting module 14 has two measure inputs 21 and 22, each coupled to cathode 4 of a respective valve V1, V2 in order to measure the anode current of such a valve V1, V2. Resistor network 12 comprises two resistors Rk1 and Rk2, each connecting a respective cathode 4 to ground. Thereby, the anode currents are indirectly measured by measuring the voltage drops on resistors Rk1 and Rk2. Indeed, the voltage drop on each of resistors Rk1 and Rk2 is proportional to the cathode current of the respective valve V1, V2. The cathode current is equal to the sum of the anode current and the suppression grid current, and the intensity of the latter is however equal to a small fraction of the intensity of the anode current and remains nearly constant as the intensity of the anode current varies. Adjusting module 14 comprises a further measure input 23 connected to output 18 to measure and monitor the feed voltage of anodes 3.

Figure 2:
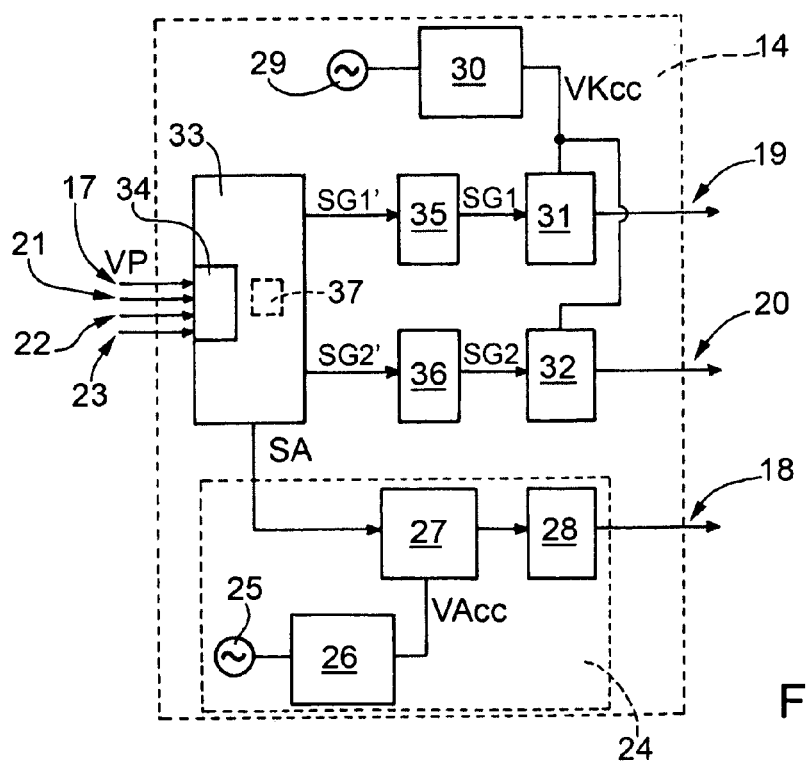
FIG. 2 shows part of the valve power amplifier stage of FIG. 1, in greater detail and by means of a block chart.

With reference to FIG. 2, the adjusting module 14 comprises a switched-mode power supply 24 for supplying voltage to anodes 3. The switched-mode power supply 24 comprises a high-voltage source 25 to generate an alternating voltage with maximum amplitude of 450 volts, for example, a rectifying module 26 supplied by source 25 to obtain a direct current voltage VAcc of 450 volts, a half bridge inverter 27 electrically supplied with voltage VAcc, and a low-pass filter 28 connected to the output of inverter 27. The output of filter 28 is the output of the switched-mode power supply 24 and coincides with output 18. Adjusting module 14 comprises further voltage supply means for polarizing the control grids 5. These voltage supply means comprise a low-voltage source 29 to generate an alternating voltage with maximum amplitude of 50 volts, for example, a rectifying module 30 supplied by the generator 29 to obtain a direct current voltage VKcc of 50 volts, and a pair of voltage buffer amplifiers 31 and 32 of the inverting type electrically supplied with voltage VKcc. The output of the buffer amplifier 31 coincides with output 19 and the output of buffer 32 coincides with output 20. The sources 25 and 29 are implemented in a known manner from the normal network voltage.

Adjusting module 14 comprises processing and control means comprising a microcontroller 33, e.g. a microcontroller commercially known with the code PIC18F8722. Microcontroller 33 incorporates an analog-digital converter (A/D) 34 with several inputs. One of the inputs of A/D converter 34 coincides with the selection input 17 for acquiring and discretizing voltage VP, and other inputs of A/D converter 34 coincide with the measure inputs 21-23 for acquiring and discretizing voltage drops on resistors Rk1 and Rk2 and the feed voltage of anodes 3. The number of levels into which voltage Vp is discretized establishes in fact the number of output power values from which the maximum output power is selected.

Microcontroller 33 is adapted to generate, as a function of voltage VP, a control signal SA consisting of a PWM signal for controlling the switched-mode power supply 24. The duty-cycle of the control signal SA is representative of an anode voltage value which should be applied to anodes 3. Indeed, the signal supplied to output 18 coincides with the average value of the signal supplied by inverter 27, and the latter signal is in turn a variable duty-cycle voltage signal with amplitude between 0 and 450 volts. Therefore, the control signal SA is adapted to control the switched-mode power supply 24 so that the anode voltage value is applied to anodes 3.

Microcontroller 33 is adapted to generate, again as a function of voltage VP, two digital signals SG1' and SG2', each of which is adapted to control a respective buffer amplifier 31, 32, when converted into the analog format. The processing and control means of adjusting module 14 comprise two digital-analog converters (D/A) 35 and 36 for converting digital signals SG1' and SG2' into corresponding analog control signals SG1 and SG2, consisting of respective low-voltage, direct current signals. The voltage value of each control signal SG1, SG2 varies from 0 to 5 volts and is representative of a grid voltage value to be applied to the respective control grid 5. Therefore, each control signal SG1, SG2 is adapted to control a respective buffer amplifier 31, 32 so that the respective grid voltage value is applied to the respective control grid 5. Buffer amplifiers 31 and 32 have a gain of −10, so as to transform voltage values between 0 and 5 volts into voltage values between 0 and −50 volts, thus adapted to polarize control grids 5.

Microcontroller 33 comprises a digital memory 37 for storing two data tables, each of which is associated with a respective valve V1, V2 and comprises a plurality of anode voltage values and a corresponding plurality of anode current values. Each pair of anode voltage and anode current values is associated with a respective one out of the predetermined output power values. The data tables are also dimensioned to comprise a plurality of grid voltage values, each of which is associated with a respective one out of the predetermined power values. The anode voltage and anode current values are preloaded on memory 37 before the amplifier stage 1 is used and in fact define the possible maximum output power values and the corresponding working points of valves V1 and V2. In the described embodiment, in which reference is made to two valves V1 and V2 connected in a push-pull configuration, adjusting module 14 allows the feed voltages in common for the two anodes 3 to be adjusted. Accordingly, the two tables contain in fact the same anode voltage values. The grid voltage values may be preloaded on memory 37 or automatically determined when amplifier stage 1 is turned according to the anode voltage and anode current values following a procedure which will be described below.

Microcontroller 33 is indeed configured to carry out the following steps.

When amplifier stage 1 is turned on, microcontroller 33 checks whether the data tables contain the grid voltage values: if they do not exist, it determines them following a trial and error procedure. In particular, microcontroller 33 controls the switched-mode power supply 24 so as to apply in sequence all the anode voltage values of the data table to the anodes 3 and, for each anode voltage value applied to the anodes 3, controls the buffer amplifiers 31 and 32 so as to vary the polarization voltages of control grids 5 within a predetermined range of voltage values. By means of the measure inputs 21 and 22, microcontroller 33 measures the anode currents of valves V1 and V2, which are generated for each voltage value of such a range of voltage values, and for each anode voltage value applied to the anodes 3, determines the corresponding grid voltage values as the polarization voltage values of the control grids 5 so that the measured anode currents are substantially equal to the anode current values. The grid voltage values thus determined are written in the data tables, i.e. are stored on memory 37.

During operation of amplifier stage 1, microcontroller 33 cyclically acquires the selection signal from potentiometer 15, i.e. cyclically reads, from the selection input 17, the voltage VP to detect variations thereof caused by a different adjustment of potentiometer 15. If a variation of voltage VP is detected, the data tables are then addressed by the selection signal, i.e. by the voltage VP in discretized form, so as to select an anode voltage value and two corresponding grid voltage values. The duty-cycle value of the control signal SA is determined as a function of the selected anode voltage value taking into consideration gains, voltage drops and offsets which occur from the switched-mode power supply 24 to anodes 3. Similarly, the voltage value of the control signals SG1 and SG2 is determined as a function of the selected grid voltage values, taking into account gains, voltage drops and offsets which occur from D/A converters 35 and 36 to control grids 5 and 6.

Microcontroller 33 is further configured to constantly monitor the feed voltage of anodes 3 for the purpose of compensating for possible supply voltage reductions due to fluctuations of sources 25 and 29 (network voltage fluctuations), to temperature variations and voltage drops in the output transformer 3 and in the rectifying module 26, which voltage drops are not negligible for high maximum output power values. The reduction of feed voltage of anodes 3 produces a very annoying crossover distortion, the polarization voltage of control grid 5 being equal. In order to reduce the crossover distortion, microcontroller 33 is configured to cyclically measure, by means of the measure input 23, the feed voltage of anodes 3 and control the buffer amplifiers 31 and 32, so as to conveniently reduce the polarization voltage of control grids 5 when the measured feed voltage is lower than the selected anode voltage value.

Finally, microcontroller 33 is configured to periodically re-determine the grid voltage values while amplifier stage 1 is on, but in the absence of audio signals at the audio signal inputs 8 and 9. This allows to keep the resting anode currents at the selected anode current values even in the presence of possible variations of polarization voltages due to fluctuations of sources 25 and 29, to temperature variations and voltage drops in the output transformer 3 and in the rectifying modules 26 and 30.

According to a further embodiment of the invention (not shown), adjusting module 14 differs from that shown in FIG. 2 in that it is free from the measure inputs 21 and 22, and in that the data table comprises only the anode voltage values and the corresponding grid voltage values. These voltage values are all pre-loaded on memory 37 before amplifier stage 1 is used.

According to a further embodiment of the invention (not shown), adjusting module 14 differs from that shown in FIG. 2 in that it is free from the measure inputs 21 and 22 and in that microcontroller 33 is not configured to determine the data table when amplifier stage 1 is turned on and address the data table as a function of the discretized voltage VP according to the above-described steps, but is simply configured to implement a first formula and at least a second formula to determine, as a function of voltage VP, the duty-cycle of control signal SA and the voltage value of control signals SG1 and SG2, respectively. Such formulae are of polynomial type and are constructed according to measurements made on amplifier stage 1 employing various types of valves.

Figure 3:
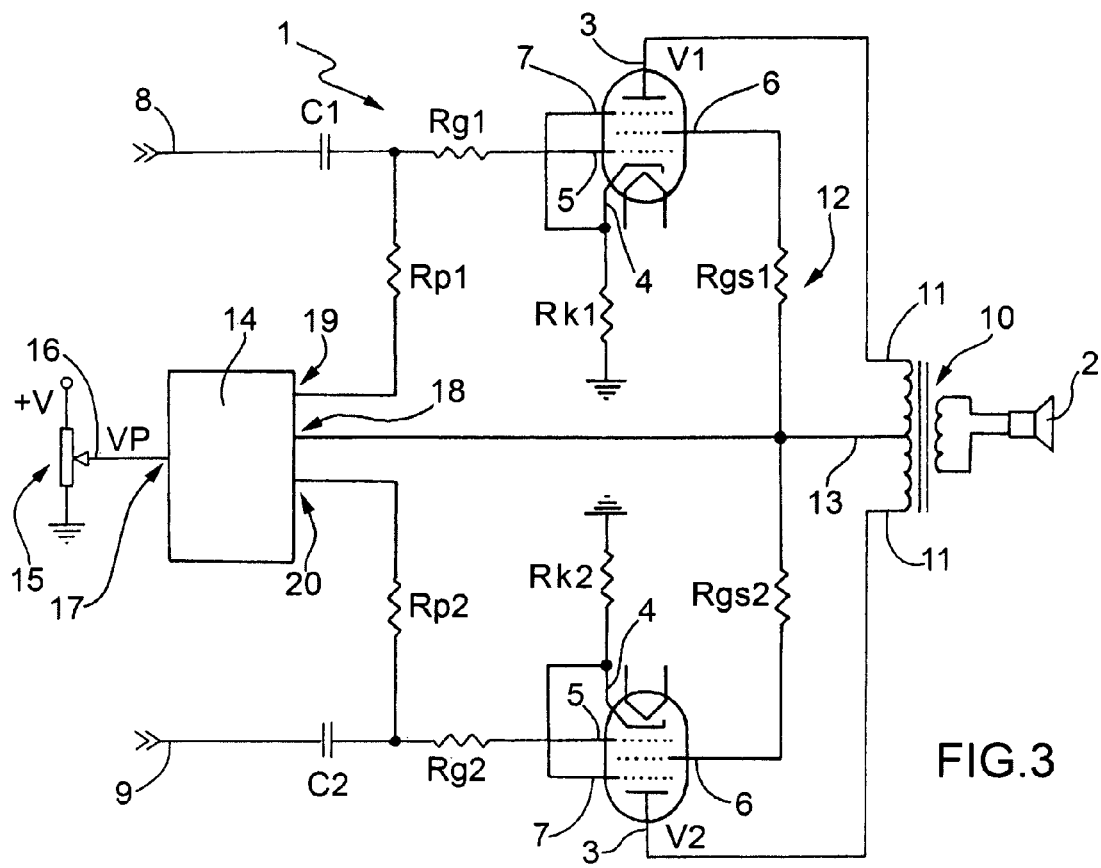
FIG. 3 shows a simplified circuit diagram of the valve power amplifier stage made according to a further embodiment of the invention.
Figure 4:
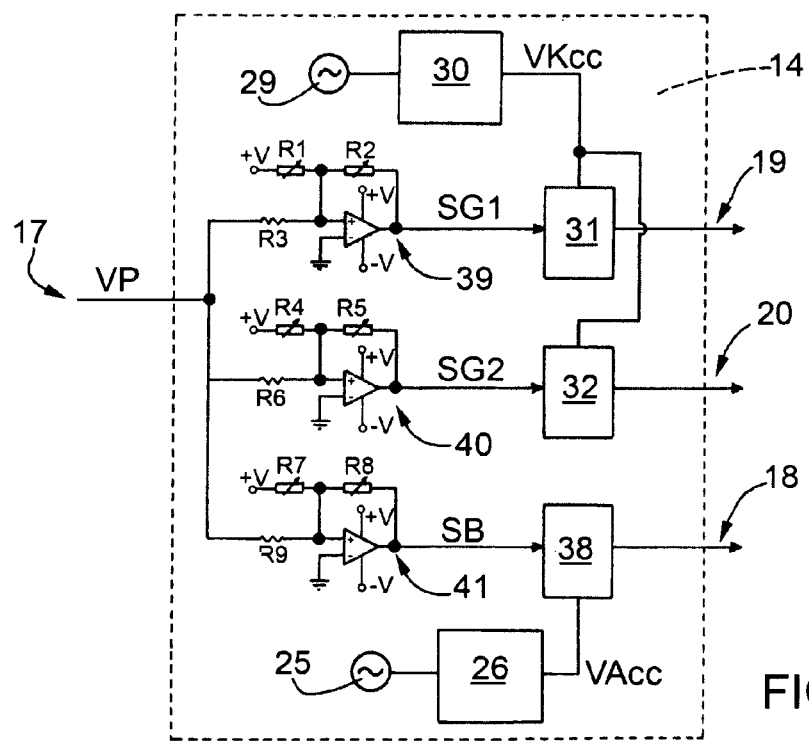
FIG. 4 shows part of the valve power amplifier stage of FIG. 3, in greater detail and by means of a block chart.

According to a further embodiment of the present invention shown in FIGS. 3 and 4, in which the corresponding elements are indicated by the same numbers and codes as FIGS. 1 and 2, adjusting module 14 (FIGS. 3 and 4) is free from the measure inputs 21-23 in FIGS. 1 and 2, the voltage supply means for supplying voltage to anodes 3 comprise, instead of inverter 27 and filter 28 in FIG. 2, a voltage buffer amplifier 38 of non-inverting type controlled by a control signal SB similar to control signals SG1 and SG2, and the processing and control means comprise, instead of microcontroller 33 and D/A converters 35 and 36 in FIG. 2, analog processing means comprising three operational amplifiers 39, 40 and 41, configured as adders for implementing three polynomial formulae, e.g. of the type $$V = VP \cdot H + V0,$$

in order to determine the voltage value of signal SG1, the voltage value of signal SG2 and the voltage value of signal SB as a function of the voltage VP. The voltage value of signal SB indicates the anode voltage value to be applied to anodes 3. The parameters H and V0 are determined according to measurements made on the amplifier stage 1 employing various types of valves.

According to further embodiments (not shown) of the invention, the selector comprises, instead of potentiometer 15, a two-button device of the "up" and "down" type for either increasing or decreasing the desired maximum output power at each touch of the "up" button or of the "down" button, respectively, or a binary switch or a communication interface of the touch screen type or any other digital or analog communication interface.

From the above, it is inferred that in the various illustrated embodiments, adjusting module 14 may be also used in an amplifier stage 1 in which the thermionic valves consist of tetrodes, which are free from the suppression grid 7, or in an amplifier stage 1 in which the thermionic valves consist of triodes, which are also free from the screen grid 6 and thus no longer need resistors Rgs1 and Rgs2, or in an amplifier stage 1 comprising a single thermionic valve, such as a triode or a pentode, connected to work in single-ended configuration. In the latter case, the part in charge of polarization of the control grid is halved, meaning that there is only a need for one buffer amplifier and one input for measuring the anode current.

According to a further aspect of the invention, a method is provided for adjusting the maximum output power of a valve power amplifier stage for an audio amplifier, the valve power amplifier stage comprising at least one thermionic valve and one polarization circuit for polarizing the thermionic valve. The method is implemented by the above-described adjusting module 14 and selector 15, and thus comprises the following steps: providing the polarization circuit with electronic adjusting means 14 for adjusting the feed voltage of anode 3 and the polarization voltage of control grid 5 of the valve; from selecting means 15 that can be activated by a user, acquiring a selection signal VP representative of a desired maximum output power selected from a plurality of predetermined output power values; and by means of the adjusting means 14, adjusting the feed voltage of anode 3 and the polarization voltage of control grid 5 as a function of the selection signal VP, so as to adjust the maximum output power to the desired maximum output power.

The advantages provided by the above-described amplifier stage 1 as compared to similar amplifier stages of known type are as follows: obtaining the same sound efficiency within a wide range of maximum output powers, considerably increasing the lifespan of the valves because their use at a reduced maximum power implies an actual reduction of power dissipation, and controlling the polarization conditions in real-time, so as to obtain the optimal polarization in all working circumstances. Moreover, the versions which implement the formulae for directly calculating the parameters of control signals SG1, SG2, SA and SB are faster when amplifier stage 1 is turned on, because they do not recalculate the data tables but are more inaccurate in operation because they do not allow the amplifier stage 1 to perfectly adapt to the valves used.

The invention claimed is:

1. A valve power amplifier stage for an audio amplifier, the valve power amplifier stage comprising at least one thermionic valve and polarization means for polarizing the anode, the cathode and the control grid of said at least one thermionic valve so as to determine the maximum output power deliverable by the thermionic valve; the valve power amplifier stage being characterized in that said polarization means comprise: electronic adjusting means for adjusting the feed voltage of the anode and the polarization voltage of the control grid in such a way as to adjust the maximum output power of said at least one thermionic valve; and selecting means coupled with said adjusting means for allowing a user to control said adjusting means so as to select the desired maximum output power among a plurality of predetermined output power values, wherein said adjusting means comprise: first voltage supplying means for supplying voltage to said anode; second voltage supplying means for polarizing said control grid; processing and control means for receiving a selection signal from said selecting means and for generating, as a function of the 19 selection signal, a first control signal, which is representative of an anode voltage value and is suited to control said first voltage supplying means in such a way that said anode voltage value is applied to the anode, and at least one second control signal, which is representative of a grid voltage value and is suited to control said second voltage supplying means in such a way that said grid voltage value is applied to the control grid, and wherein said processing and control means comprise memory means for memorizing at least one data table associated to said at least one thermionic valve, the data table comprising a plurality of anode voltage values and a corresponding plurality of grid voltage values, each pair of anode voltage and grid voltage values being associated to a respective one of said predetermined output power values; said processing and control means being configured to address the data table as a function of said selection signal so as to select one of said pairs of voltage values and to generate said first control signal as a function of the selected anode voltage value and said at least one second control signal as a function of the selected grid voltage value.

2. The valve power amplifier stage according to claim 1, wherein said data table comprises a plurality of anode current values, each of which is associated to a respective one of said predetermined output power values; said processing and control means comprising at least one measure input coupled with said cathode for measuring the anode current of said at least one thermionic valve; said processing and control means being configured to modulate, at least each time the valve power amplifier stage is turned on, said first control signal and said at least one second control signal in such a way as to determine, for each anode voltage value of the table data, the corresponding grid voltage value as the polarization voltage of the control grid such that the measured anode current is substantially equal to the corresponding anode current value.

3. The valve power amplifier stage according to claim 1, wherein said first control signal is a PWM signal, whose duty-cycle is representative of said anode voltage value; said first voltage supplying means comprising a switched-mode power supply controlled by means of the first control signal and presenting an output connected to said anode through the primary winding of an output transformer.

4. The valve power amplifier stage according to claim 1, wherein said at least one second control signal is a direct current low-voltage signal, whose voltage value is representative of said grid voltage value; said second voltage supplying means comprising voltage amplifying means, which present at least one output connected to said control grid and are controlled by means of the second control signal.

5. The valve power amplifier stage according to claim 1, wherein said processing and control means are configured to implement a first formula and a second formula in order to determine, as a function of said selection signal, a first parameter relative to said first control signal and, respectively, a second parameter relative to said second control signal.

6. The valve power amplifier stage according to claim 5, wherein said processing and control means comprise analog processing means implementing said first formula and second formula; said first voltage supplying means comprising first amplifying means, which present an output coupled with said anode and are controlled by means of said first control signal; said second voltage supplying means comprising second amplifying means, which present at least one output connected to said control grid and are controlled by means of said at least one second control signal.

7. The valve power amplifier stage according to claim 1, comprising two thermionic valves connected in push-pull configuration; said processing and control means being suited to generate, as a function of said selection signal, two second control signals representative of two respective determined grid voltage values; said second voltage supplying means comprising two voltage amplification units, each of which is connected to the control grid of a respective thermionic valve and is controlled by a respective one of the two second control signals in order to apply to the control grid a respective one of the two grid voltage values so as to adjust in an independent manner the polarization voltage of the two control grids.

8. The valve power amplifier stage according to claim 2, comprising two thermionic valves connected in push-pull configuration; said processing and control means comprising two measure inputs, each of which is coupled with the cathode of a respective thermionic valve in order to measure the anode current of the thermionic valve.

9. A method for adjusting the maximum output power of a valve power amplifier stage for an audio amplifier, the valve power amplifier stage comprising at least one thermionic valve and polarization means for polarizing the anode, the cathode and the control grid of said at least one thermionic valve so as to determine the maximum output power deliverable by the thermionic valve; the method being characterized in that it comprises:

providing said polarization means with electronic adjusting means able to adjust the feed voltage of the anode and the polarization voltage of the control grid;

acquiring, from selecting means that can be activated by a user, a selection signal representative of a desired maximum output power selected among a plurality of predetermined output power values; and adjusting, by means of the adjusting means, the feed voltage of the anode and the polarization voltage of the control grid as a function of the selection signal in such a way as to adjust the maximum output power to the desired maximum output power, wherein said adjusting means comprise first voltage supplying means for supplying power to said anode; second voltage supplying means for polarizing said control grid; adjusting the feed voltage of the anode and the polarization voltage of the control grid as a function of the selection signal comprising:

generating, as a function of the selection signal, a first control signal representative of an anode voltage value and at least one second control signal representative of a grid voltage value; and controlling the first voltage supplying means by means of the first control signal in such a way as to apply the anode voltage value to said anode and the second voltage supplying means by means of the second control signal in such a way as to apply the grid voltage value to said control grid, and wherein adjusting the feed voltage of the anode and the polarization voltage of the control grid as a function of the selection signal comprises:

determining at least one data table associated to said at least one thermionic valve, the data table comprising a plurality of anode voltage values and a corresponding plurality of grid voltage values, each pair of anode voltage and grid voltage values being associated to a respective one of said predetermined output power values; generating a first control signal representative of an anode voltage value and at least one second control signal representative of a grid voltage value comprising:

addressing the data table as a function of said selection signal so as to select an anode voltage value and a corresponding grid voltage value; and generating the first control signal as a function of the selected anode voltage value and the second control signal as a function of the selected grid voltage value.

10. The method according to claim 9, wherein said table comprises a plurality of predetermined anode current values, each of which is associated to a respective one of said predetermined output power values; the step of determining the data table being carried out at least every time said valve power amplifier stage is turned on and comprising:

controlling said first voltage supplying means in such a way as to apply in sequence said anode voltage values of the table to said anode;

controlling, for each anode voltage value applied to the anode, said second voltage supplying means in such a way as to vary the polarization of the control grid within a predetermined interval of voltage values;

measuring the anode current of said at least one thermionic valve; and determining, for each anode voltage value applied to the anode, the corresponding grid voltage value as the polarization voltage of the control grid such that the anode current measured is substantially equal to the corresponding value of anode current.

11. The method according to claim 9, wherein generating a first control signal representative of an anode voltage value and at least one second control signal representative of a voltage of the control grid value comprises:

determining, as a function of the selection signal, a parameter of said first control signal and a parameter of said second control signal by means of a first formula and, respectively, a second formula.

\* \* \* \* \*